United States Patent
Hine et al.

(10) Patent No.: US 11,515,280 B2
(45) Date of Patent: Nov. 29, 2022

(54) MOUNTING STRUCTURE AND NANOPARTICLE MOUNTING MATERIAL

(71) Applicant: Panasonic Intellectual Property Management Co., Ltd., Osaka (JP)

(72) Inventors: Kiyohiro Hine, Osaka (JP); Hidetoshi Kitaura, Osaka (JP); Akio Furusawa, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 202 days.

(21) Appl. No.: 16/790,372

(22) Filed: Feb. 13, 2020

(65) Prior Publication Data

US 2020/0185347 A1   Jun. 11, 2020

Related U.S. Application Data

(63) Continuation of application No. PCT/JP2019/005254, filed on Feb. 14, 2019.

(30) Foreign Application Priority Data

Apr. 12, 2018   (JP) .............................. JP2018-076801

(51) Int. Cl.
  *C22C 5/06* (2006.01)
  *H01L 23/00* (2006.01)
  *B22F 1/054* (2022.01)
(52) U.S. Cl.
  CPC .............. *H01L 24/29* (2013.01); *B22F 1/054* (2022.01); *C22C 5/06* (2013.01); *H01L 24/83* (2013.01);
(Continued)

(58) Field of Classification Search
  CPC . B22F 1/054; C22C 5/06; H01L 24/29; H01L 24/83; H01L 2224/29239;
(Continued)

(56) References Cited

U.S. PATENT DOCUMENTS 5,930,583 A    7/1999  Yasue et al.
6,791,045 B1   9/2004  Yamamoto et al.
(Continued)

FOREIGN PATENT DOCUMENTS

EP    2924719 A1 *  9/2015  ......... H01L 23/3735
JP    57107041 A  *  7/1982  ....... H01L 23/49513
(Continued)

OTHER PUBLICATIONS

C.T. Tomizuka et al., "Self-Diffusion in Silver", 1956, Physical Reviews, 103, p. 1182-1184. (Year: 1956).*
(Continued)

*Primary Examiner* — Humera N. Sheikh
*Assistant Examiner* — Katherine A Christy
(74) *Attorney, Agent, or Firm* — Wenderoth, Lind & Ponack L.L.P.

(57) ABSTRACT

A mounting structure is used, which includes: a semiconductor element including an element electrode; a metal member; and a sintered body configured to bond the semiconductor element and the metal member is used, in which the sintered body contains a first metal and a second metal solid-dissolved in the first metal, the second metal is a metal having a diffusion coefficient in the first metal larger than a self-diffusion coefficient of the first metal, and a content ratio of the second metal relative to a total mass of the first metal and the second metal in the sintered body is equal to or lower than a solid solution limit of the second metal to the first metal.

3 Claims, 2 Drawing Sheets

(52) U.S. Cl.
CPC ............... *H01L 2224/29239* (2013.01); *H01L 2224/29247* (2013.01); *H01L 2224/29311* (2013.01); *H01L 2224/29316* (2013.01); *H01L 2224/29347* (2013.01); *H01L 2224/8384* (2013.01); *H01L 2924/3651* (2013.01)

(58) Field of Classification Search
CPC . H01L 2224/29247; H01L 2224/29311; H01L 2224/29316; H01L 2224/29347; H01L 2224/8384; H01L 2924/3651
USPC .............................. 29/842; 257/741; 420/501
See application file for complete search history.

(56) References Cited

U.S. PATENT DOCUMENTS

| | | | |
|---|---|---|---|
| 2012/0211764 A1* | 8/2012 | Okamoto | H01L 24/27 257/772 |
| 2014/0248505 A1* | 9/2014 | Kalich | B23K 1/0006 228/198 |
| 2015/0041974 A1 | 2/2015 | Kobayashi et al. | |
| 2018/0342478 A1* | 11/2018 | Nakako | H01L 24/83 |
| 2019/0273062 A1 | 9/2019 | Fujiwara et al. | |

FOREIGN PATENT DOCUMENTS

| | | | | |
|---|---|---|---|---|
| JP | 60029434 A | * | 2/1985 | ............ B23K 35/30 |
| JP | 10-068004 | | 3/1998 | |
| JP | 10152737 A | * | 6/1998 | ............... C22C 9/06 |
| JP | 2011-029472 | | 2/2011 | |
| JP | 2012-178507 | | 9/2012 | |
| JP | 2012178507 A | * | 9/2012 | ............ H01L 21/52 |
| JP | 2017-101313 | | 6/2017 | |
| WO | 2001/004368 | | 1/2001 | |
| WO | 2013/133085 | | 9/2013 | |
| WO | WO-2015060173 A1 | * | 4/2015 | ................ B22F 1/00 |
| WO | WO-2015060245 A1 | * | 4/2015 | ................ B22F 1/00 |
| WO | 2018/116813 | | 6/2018 | |

OTHER PUBLICATIONS

C.-X. Yang et al., "Enhanced pressureless bonding by Tin Doped Silver Paste at low sintering temperature", 2016, Materials Science and Engineering: A, 660, p. 71-76. (Year: 2016).*

FiberLabs, "Light Emitting Diode (LED)", 2022 (Year: 2022).*

MuRata, "EMSC SiCap—Assembly by Wirebonding", 2022 (Year: 2022).*

International Search Report of PCT application No. PCT/JP2019/005254 dated Mar. 12, 2019.

* cited by examiner

[FIG. 1]
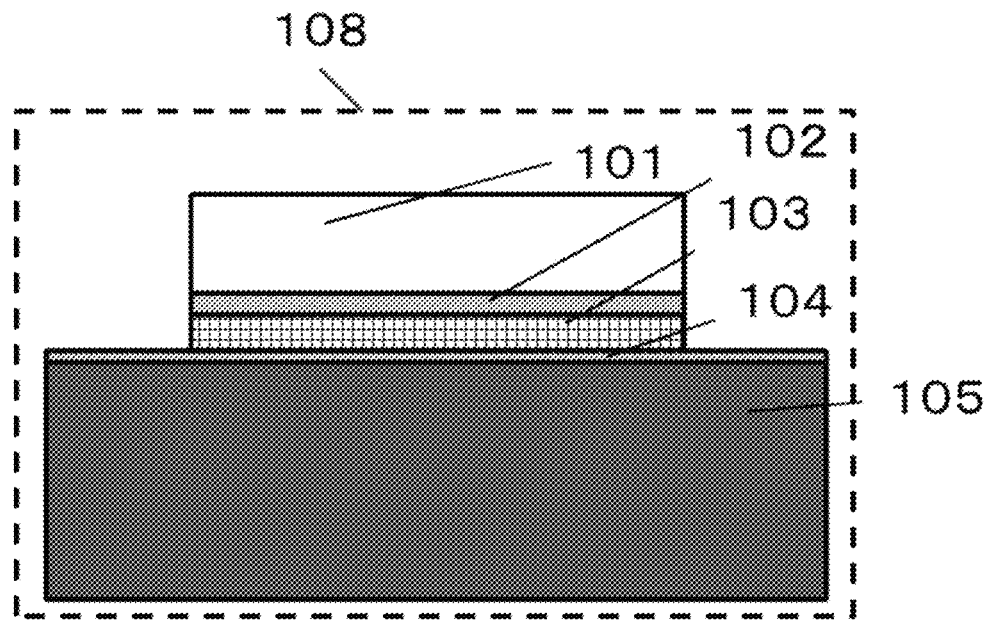
[FIG. 2]
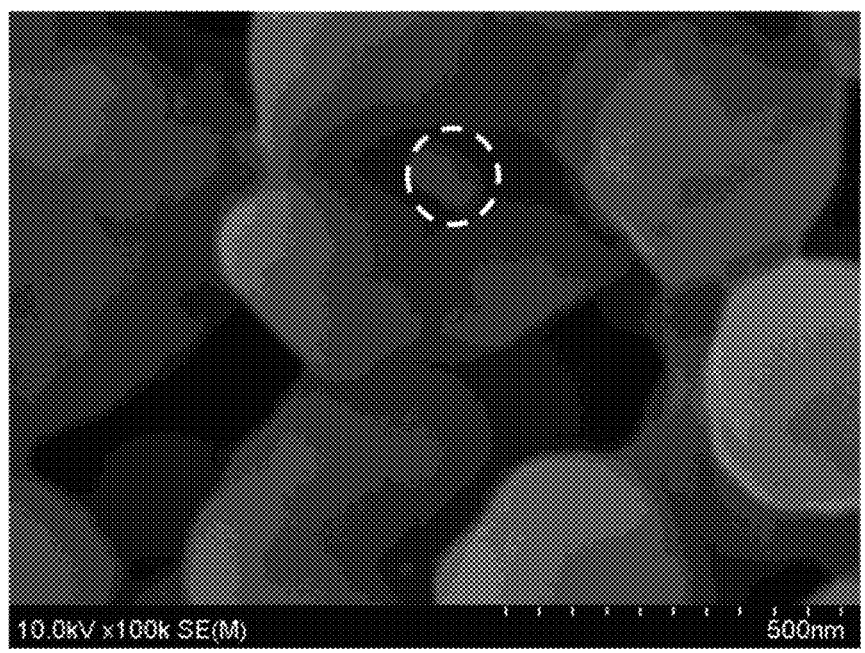

[FIG. 3]
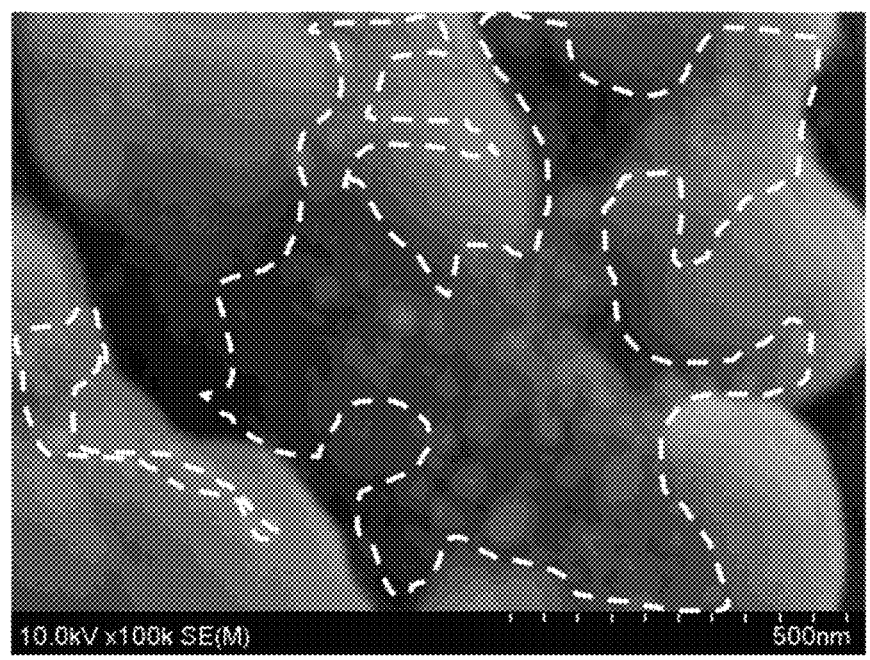

MOUNTING STRUCTURE AND NANOPARTICLE MOUNTING MATERIAL

TECHNICAL FIELD

The present disclosure relates to a mounting structure having a structure in which two members are bonded by a metal material and to be used in equipment such as a power device, and to a nanoparticle mounting material for manufacturing the mounting structure.

BACKGROUND ART

Equipment, such as a power device, including a semiconductor element generating heat may have a mounting structure in which two members including a substrate and a heat dissipation portion are bonded in order to transfer heat from the substrate, on which the semiconductor element is mounted, to the heat dissipation portion for a purpose of dissipating the heat generated from the semiconductor element.

In recent years, from a viewpoint of energy saving, as the power device, use of next generation power device elements such as an SiC element and a GaN element having an advantage that power can be controlled with high efficiency is increased compared with a Si element in the related art. These next generation power device elements have an advantage of being capable of operating even at a high temperature, and can resist heat generation more than the Si element in the related art, and therefore, control may be performed by flowing a larger current. However, when the larger current flows, an amount of the heat generated from the semiconductor element increases, and a temperature of the semiconductor element increases. As a result, a temperature Tj of a bonding portion between an electrode such as a lead frame for flowing a current controlled by the semiconductor element and an element electrode also increases. For example, the temperature Tj of the bonding portion when the Si element in the related art is used is about 125° C., and reaches 200° C. to 250° C. when the SiC element and the GaN element are used.

Therefore, the bonding portion between the element electrode and the lead frame electrode is required to have heat conductivity for efficiently releasing the generated heat to the lead frame and heat resistance for dealing with the higher temperature Tj of the bonding portion.

In the related art, a solder material is widely used in a bonding material used in the bonding portion of the mounting structure at which the element electrode and the lead frame electrode are bonded with a conductor because bonding at a low temperature is possible for the solder material. However, 200° C. to 250° C., the temperature Tj of the bonding portion when the SiC element and the GaN element are used, is a temperature close to or higher than a melting point of commonly used solder materials mainly composed of Sn or Pb, and is a very severe temperature. Therefore, in the mounting structure in which these solder materials are used for the bonding portion, it is difficult to ensure the heat resistance when the SiC element and the GaN element are used.

In order to solve such a problem, an expectation for amounting structure in which the element electrode and the lead frame electrode are bonded by sintering a metal such as Ag and Cu is rising. The metal such as Ag and Cu has excellent heat conductivity, and the melting point thereof is sufficiently high with respect to 200° C. to 250° C., the temperature Tj of the bonding portion, and is thus excellent in heat resistance. However, since the metal such as Ag and Cu has a high melting point, it is necessary to heat the metal to 1000° C. to 1200° C. to melt the metal and bond the element electrode and the lead frame electrode by solid-liquid diffusion therebetween as the bonding of the solder material in the related art, so that practical application is difficult.

In order to facilitate the above bonding when a high melting point metal such as Ag and Cu is used, use of particles of the high melting point metal having an average particle diameter of several nm to several hundred nm as a nanoparticle mounting material is studied. The nano-sized metal particle has a very large specific surface area, which is a proportion of a surface area occupied by the particles, compared to that of metal particles having an average particle diameter greater than or equal to micron size. The metal particles on the surface at this time are in an unstable state compared to a bulk metal, and have large surface energy. Therefore, the nano-sized metal particles can be bonded by being sintered at a temperature (for example, 150° C. to 400° C.) much lower than the melting point thereof.

However, when the bonding is performed by sintering the nanoparticle mounting material such as Ag and Cu, a time required for a heating process for diffusing these metals between solid phases is 30 min to 60 min or longer. The time is far longer than 5 min of the solder material in the related art. In order to shorten the time required for the heating process, it is necessary to sinter a vapor nanoparticle mounting material at a higher temperature. However, when the temperature during the sintering is increased, thermal damage occurs to a peripheral member exposed to the high temperature during the sintering. On the other hand, when a holding temperature during the bonding is set to a low temperature in order to prevent the thermal damage to the peripheral member, the time required for the heating process increases exponentially, and in particular, cost increases in mass production. In this way, when the element electrode and the lead frame electrode are bonded by sintering the nanoparticle mounting material, it is difficult to improve quality of a product while preventing the thermal damage to the peripheral member and to reduce the cost while shortening a lead time for mass production. Therefore, there is a demand for a nanoparticle mounting material that does not increase the thermal damage to the peripheral member while shortening the time required for the bonding.

PTL 1 discloses a bonding material containing a first metal microparticle having, on a surface thereof, an organic coating film capable of being desorbed by heating and a second metal microparticle having a liquid phase formation temperature lower than a desorption start temperature of the organic film and containing a metal capable of forming an intermetallic compound by a reaction with the first metal microparticle. In the bonding material described in PTL 1, first, the second metal particles are heated at a temperature (250° C. or lower) at which a liquid phase thereof is formed, and then heated at a temperature (about 250° C. to 350° C.) at which the organic coating film is desorbed from the surface of the first metal microparticles to form an intermetallic compound. When a bonding layer is formed by the above method, the formation of the intermetallic compound uniformly occurs in the bonding material, and a bonding layer having excellent bonding strength is formed, which is described in PTL 1.

CITATION LIST

Patent Literature

PTL 1: JP-A-2017-101313

SUMMARY OF INVENTION

According to the bonding material described in PTL 1, it is expected that the time required for bonding in the related art can be shortened without increasing the thermal damage to the peripheral member, so that the bonding can be performed at a lower temperature. However, as described in PTL 1, when the intermetallic compound of the first metal microparticles and the second metal microparticles is formed by melting the second metal microparticles, the heat resistance of the first metal is changed due to an occurrence of brittleness unique to the intermetallic compound.

The invention has been made in view of the above problems, and relates to a mounting structure in which the element electrode and the metal member are bonded by sintering the metal nanoparticles, and an object of the invention is to provide a mounting structure in which the thermal damage to the peripheral member during sintering is reduced by shortening the time required for bonding by sintering, the formation of the intermetallic compound by the sintering is prevented and physical properties of a metal constituting the nanoparticles is difficult to deteriorate, and a nanoparticle mounting material for manufacturing the mounting structure.

In order to achieve the above object, a mounting structure is used, which includes: a semiconductor element including an element electrode; a metal member; and a sintered body configured to bond the semiconductor element and the metal member, in which the sintered body contains a first metal and a second metal solid-dissolved in the first metal, the second metal is a metal having a diffusion coefficient in the first metal larger than a self-diffusion coefficient of the first metal, and a content ratio of the second metal relative to a total mass of the first metal and the second metal in the sintered body is equal to or lower than a solid solution limit of the second metal to the first metal.

In addition, a nanoparticle mounting material is used, which includes: at least nanoparticles of a first metal and nanoparticles of a second metal solid-dissolved in the first metal, in which a proportion of the nanoparticles of the first metal having a particle diameter of 100 nm or less relative to a total number of the nanoparticles of the first metal is 50% or more, and the average particle diameter of the nanoparticles of the second metal is 100 nm or less, the second metal is a metal having a diffusion coefficient in the first metal larger than a self-diffusion coefficient of the first metal, and a proportion of a mass of the second metal relative to the total mass of the first metal and the second metal is equal to or less than a solid solution limit of the second metal to the first metal.

According to the invention, it is possible to provide amounting structure in which the thermal damage to the peripheral member during sintering is reduced by shortening the time required for bonding by sintering, the formation of the intermetallic compound by the sintering is prevented and the physical properties of a metal constituting the nanoparticles is difficult to deteriorate, and to provide a nanoparticle mounting material for manufacturing the mounting structure.

BRIEF DESCRIPTION OF DRAWINGS

FIG. 1 is a cross-sectional view in a direction parallel to a thickness direction of a bonding portion from a semiconductor element to a lead frame of a mounting structure in the present embodiment.

FIG. 2 is a cross-sectional SEM image of a sintered body in the mounting structure of Example 1-4 in the present embodiment.

FIG. 3 is a cross-sectional SEM image of a sintered body in the mounting structure of Comparative Example 1-1.

DESCRIPTION OF EMBODIMENTS

Hereinafter, a mounting structure, a nanoparticle mounting material for manufacturing the mounting structure, and a method for manufacturing the mounting structure according to one embodiment of the invention will be described in detail.

(Structure)

FIG. 1 is a cross-sectional view in a direction parallel to a thickness direction of a bonding portion from a semiconductor element to a lead frame of a mounting structure in the present embodiment.

Amounting structure 108 in the present embodiment is amounting structure in which a semiconductor element 101 including an element electrode 102 and a lead frame 105 including a lead frame electrode 104 are bonded via a sintered body 103.

The mounting structure 108 has a structure in which the semiconductor element 101 such as a transistor is supported by the lead frame 105 and connected to an external wiring by the lead frame 105. The semiconductor element 101 and the lead frame 105 are electrically and mechanically connected by bonding the element electrode 102 of the semiconductor element 101 and the lead frame electrode 104 of the lead frame 105 via the sintered body 103.

In the present embodiment, the sintered body 103 is a structure formed by sintering nano-sized metal particles, and is a sintered body containing a first metal and a second metal.

The size of the nano-sized metal particles is preferably from 50 nm to 100 nm in average particle diameter.

The average particle diameter is calculated using a laser particle diameter distribution meter. The average particle diameter is a median diameter d50% (μm, in terms of volume). The same applies below.

The first metal is conductive, has high heat conductivity, and has heat resistance so as to withstand 200° C. to 250° C., a temperature Tj of a bonding portion (sintered body 103) between the semiconductor element 101 and the lead frame 105 when a SiC element and a GaN element are used. Examples of the first metal include Ag and Cu.

Here, the temperature Tj of the bonding portion refers to a maximum temperature at a bonding portion interface when the semiconductor element operates.

The second metal can be solid-dissolved in the first metal, and at least a part of the second metal is solid-dissolved in the first metal in the sintered body 103. The second metal is an element whose diffusion coefficient in the first metal is larger than a self-diffusion coefficient of the first metal. Here, the self-diffusion coefficient refers to a coefficient at which metal atoms diffuses in the metal.

Examples of the second metal include Sn, Cu, Pb and Ge when the first metal is Ag, and Ge when the first metal is Cu.

As will be described later, the sintered body 103 is formed by sintering a nanoparticle mounting material containing nanoparticles of the first metal and nanoparticles of the second metal. During sintering, since the diffusion coefficient of the nanoparticles of the second metal in the first metal is larger than the self-diffusion coefficient of the first metal, the nanoparticles of the second metal diffuse more quickly than the first metal, which makes it easy to bond the nanoparticles of the first metal. Therefore, the second metal can shorten a time required for bonding the nanoparticles of the first metal and shorten a time required for bonding by sintering. Accordingly, thermal damage to a peripheral member during the sintering can be reduced. Further, at this time, since the nanoparticles of the second metal decreases by solid-dissolving the second metal in the first metal by the diffusion, the phase of the second metal is not formed in the sintered body 103, and properties such as conductivity, heat conductivity, and heat resistance of the first metal are not easily damaged.

The diffusion coefficient of the second metal in the first metal and the self-diffusion coefficient of the first metal can be known values, and may be determined based on a value at a temperature, for example, 200° C. for preparing the sintered body 103.

In the sintered body 103, a content ratio of the second metal relative to the total mass of the first metal and the second metal is less than or equal to a solid solution limit of the second metal to the first metal. Accordingly, an intermetallic compound of the first metal and the second metal is formed, and thus it is possible to prevent changes in the properties such as conductivity, heat conductivity, and heat resistance of the first metal.

On the other hand, in order to sufficiently bond the nanoparticles of the first metal during sintering in a low temperature and in a short time and to prevent deterioration in conductivity, heat conductivity, and heat resistance due to remaining unsintered nanoparticles, it is preferable to increase the content ratio of the second metal as much as possible to equal to or lower than the solid solution limit. Specifically, the content ratio of the second metal can be 70% or more and 100% or less relative to the solid solution limit. For example, when the first metal is Ag and the second metal is Sn (the solid solution limit of Sn is 10 mass %), the content ratio of Sn as the second metal can be 7 mass % or more and 10 mass % or less relative to the total mass of the first metal and the second metal.

The solid solution limit of the second metal to the first metal can be obtained from an equilibrium state diagram of the first metal and the second metal, and may be a solid solution limit at a temperature, for example, 200° C. for preparing the sintered body 103.

(Nanoparticle Mounting Material)

The nanoparticle mounting material in the present embodiment is a mounting material containing at least the nanoparticles of the first metal and the nanoparticles of the second metal.

In the present embodiment, the first metal is also conductive, has high heat conductivity, and has heat resistance so as to withstand 200° C. to 250° C., the temperature Tj of the bonding portion (sintered body 103) between the semiconductor element 101 and the lead frame 105 when the SiC element and the GaN element are used. Examples of the first metal include Ag and Cu.

In the present embodiment, the second metal can also be solid-dissolved in the first metal, and is an element whose diffusion coefficient in the first metal is larger than the self-diffusion coefficient of the first metal. Examples of the second metal include Sn, Cu, Pb and Ge when the first metal is Ag, and Ge when the first metal is Cu.

In the present embodiment, the proportion of the mass of the second metal relative to the total mass of the first metal and the second metal is also less than or equal to the solid solution limit of the second metal to the first metal. The content ratio of the second metal can be 70% or more and 100% or less relative to the solid solution limit. When the first metal is Ag and the second metal is Sn (the solid solution limit of Sn is 10 mass %), the content ratio of Sn as the second metal can be 7 mass % or more and 10 mass % or less relative to the total mass of the first metal and the second metal.

In the present embodiment, a proportion of nanoparticles of the first metal having a particle diameter of 100 nm or less relative to the total number of the nanoparticles of the first metal is 50% or more. The specific surface area of the nanoparticles increases as the particle diameter of the nanoparticles of the first metal gets smaller, which facilitates sintering at a lower temperature.

In addition, in the present embodiment, the average particle diameter of the nanoparticles of the second metal is 100 nm or less. As the average particle diameter of the nanoparticles of the second metal gets smaller, the second metal can be solid-dissolved into the first metal more easily and the time required for sintering can also be shortened. In addition, as the average particle diameter of the nanoparticles of the second metal gets smaller, the second metal can be solid-dissolved in the first metal more easily and it is possible to prevent the change in the properties such as conductivity, heat conductivity, and heat resistance of the first metal due to the nanoparticles of the second metal remaining in the sintered body 103 after sintering.

The nanoparticle mounting material may contain an organic solvent for imparting a coating property to the electrode or imparting dispersibility to the nanoparticles, a dispersant for preventing aggregation of the nanoparticles during storage, and a reducing agent for removing an oxide film formed on the surface of the nanoparticles.

(Process)

The method of manufacturing the mounting structure according to the present embodiment includes a step of bonding the element electrode of the semiconductor element and the lead frame electrode of the lead frame by sintering the nanoparticles of the first metal and the nanoparticles of the second metal using the above nanoparticle mounting material.

(1) Nanoparticle Mounting Material Preparation Step

Firstly, a nanoparticle mounting material containing nanoparticles of the first metal and nanoparticles of the second metal is prepared. The nanoparticle mounting material may contain an organic solvent, a dispersant, and a reducing agent.

(2) Nanoparticle Mounting Material Supply Step

Then, the nanoparticle mounting material is supplied to the lead frame electrode 104 on the lead frame 105 by using a metal mask or the like. The lead frame electrode 104 may be formed of Cu or the like.

(3) Element Placement Step

Further, the semiconductor element 101 is placed on the supplied nanoparticle mounting material such that the element electrode 102 is in contact with the nanoparticle mounting material. The element electrode 102 may have an outermost layer formed of Au or the like.

(4) Bonding Step

Finally, the lead frame 105 on which the semiconductor element 101 and the nanoparticle mounting material are placed is put into an air flow type heating furnace and heated in an air atmosphere. The heating condition is not particularly limited, and may be, for example, about 20 min at 200° C.

As a result, growth of the particles occurs by sintering the nanoparticles of the first metal and the nanoparticles of the second metal in the nanoparticle mounting material, and the sintered body 103 composed of a set of aggregates with 200 nm or more is formed. At this time, the respective elements mutually diffuse in a range of about several nanometers in thickness from an interface between the element constituting the element electrode 102 and the first metal and the second metal, and the respective elements mutually diffuse in a range of several nanometers in thickness from an interface between the elements constituting the lead frame electrode 104 and the first metal and the second metal, so that the element electrode 102 and the lead frame electrode 104 are bonded together and the mounting structure 108 is prepared.

EXAMPLES

The invention will be described in detail based on Examples, but the invention is not limited to these Examples.

Example 1

1. Preparation of Mounting Structure

Nanoparticles of Ag having an average particle diameter of 100 nm were prepared as the nanoparticles of the first metal, and nanoparticles of Sn having an average particle diameter of 100 nm, nanoparticles of Sb having an average particle diameter of 100 nm, and Pd nanoparticles having an average particle diameter of 100 nm were prepared as the nanoparticles of the second metal. When the nanoparticles of the first metal were observed with a scanning electron microscope (SEM), a proportion of the nanoparticles having a particle diameter of 100 nm or less was 50% relative to the number of the nanoparticles of the first metal observed.

The nanoparticles of the first metal and the nanoparticles of the second metal in a total amount of 70 mass %, polyethylene glycol (average molecular weight is 200) in an amount of 29 mass % as an organic solvent, and a dispersant and a reducing agent in a total amount of 1 mass % were mixed to prepare a nanoparticle mounting material. At this time, the nanoparticles of the first metal and the nanoparticles of the second metal were mixed at different ratios in the total amount of 70 mass %, to obtain a plurality of nanoparticle mounting materials.

A lead frame electrode made of Cu was disposed on the lead frame. Further, the nanoparticle mounting material was poured onto a metal mask having a length of 1 mm, a width of 1 mm, and a thickness of 50 μm disposed on the surface of the lead frame electrode. Further, a semiconductor element including an element electrode having the outermost layer formed of Au was placed such that the element electrode was in contact with the nanoparticle mounting material. Thereafter, the lead frame on which the semiconductor element was placed was put into the air flow type heating furnace, and heated in an air atmosphere at 200° C. for 20 min to obtain a mounting structure.

The self-diffusion coefficient of Ag in Ag at 200° C. is $10^{-24}$ m$^2$/sec, while the diffusion coefficient of Sn in Ag at 200° C. is $10^{-22}$ m$^2$/sec. The diffusion coefficient of Sb in Ag at 200° C. is $10^{-25}$ m$^2$/sec, and the diffusion coefficient of Pd in Ag at 200° C. is $10^{-34}$ m$^2$/sec.

The solid solution limit of Sn to Ag is 10 mass %.

2. Evaluation

The prepared mounting structure was embedded in an epoxy resin, and then was mirror-polished from a semiconductor element side using a polishing paper and a buff to expose a cross section near the center in the thickness direction of the sintered body 103 formed by heating the nanoparticle mounting material. The cross section was observed by SEM, and the proportion of the unsintered nanoparticles, the presence of the intermetallic compound and the remaining state of the nanoparticles of the second metal were observed.

(Proportion of Unsintered Nanoparticles)

An image of the cross section was taken with the SEM at 10,000 times, and a proportion of the particles having a particle diameter of 100 nm or less relative to the total number of particles observed in the field of view was calculated to be the proportion of the unsintered nanoparticles.

The proportion of the unsintered nanoparticles being smaller than a value in a case of not adding Sn as the second metal was evaluated as passed.

(Presence of Intermetallic Compound)

When a phase having a different lightness was confirmed the SEM image, an energy dispersion X-ray analysis (EDX analysis) of phase having a different brightness was performed. When the phase having a different lightness was a phase containing the first metal and the second metal, it was determined that the intermetallic compound was formed.

Those with no intermetallic compound were evaluated as passed.

(Remaining of Nanoparticles of Second Metal)

When a phase having a different lightness was confirmed in the SEM image, the EDX analysis (energy dispersion X-ray analysis) of a phase having a different brightness was performed. When the phase having a different lightness was a phase substantially composed of only the second metal, it was determined that the nanoparticles of the second metal remained without sintering.

Those with no remaining second metal were evaluated as passed.

Table 1 shows, in Example 1, the types of the first metal and the second metal, the proportion (content ratio) of the mass of the nanoparticles of the second metal (Sn) relative to the total mass of the nanoparticles of the first metal (Ag) and the nanoparticles of the second metal (Sn), and the results of the above evaluation.

TABLE 1

| | Nanoparticle mounting material | | | Evaluation | | | |
|---|---|---|---|---|---|---|---|
| | First metal | Second metal | Content ratio of second metal (%) | Unsintered proportion (%) | Intermetallic compound | Remaining of second metal | Acceptability |
| Example 1-1 | Ag | Sn | 2.5 | 28 | No | No | ○ |
| Example 1-2 | Ag | Sn | 5.0 | 25 | No | No | ○ |

TABLE 1-continued

| | Nanoparticle mounting material | | | Evaluation | | | |
|---|---|---|---|---|---|---|---|
| | First metal | Second metal | Content ratio of second metal (%) | Unsintered proportion (%) | Intermetallic compound | Remaining of second metal | Acceptability |
| Example 1-3 | Ag | Sn | 7.5 | 16 | No | No | ○ |
| Example 1-4 | Ag | Sn | 10.0 | 2 | No | No | ○ |
| Comparative Example 1-1 | Ag | — | 0.0 | 33 | No | No | X |
| Comparative Example 1-2 | Ag | Sn | 12.5 | 0 | Yes | No | X |
| Comparative Example 1-3 | Ag | Sb | 5.0 | 36 | No | Yes | X |
| Comparative Example 1-4 | Ag | Pd | 5.0 | 40 | No | Yes | X |

FIG. 2 shows a cross-sectional SEM image of the sintered body 103 in the mounting structure of Example 1-4. For comparison, FIG. 3 shows a cross-sectional SEM image of the sintered body 103 in the mounting structure of Comparative Example 1-1.

In FIG. 2, particles having a particle diameter of 100 nm or less are not found in the aggregate after the bonding except for a portion indicated by the dotted line. It was confirmed that, in the sintered body 103 in the mounting structure of Example 1-4, the sintering of the nanoparticle mounting material proceeded well. On the other hand, in FIG. 3, a proportion of the aggregate containing particles having a particle diameter of 100 nm or less indicated by the dotted line is clearly larger than that in FIG. 2. It was confirmed that, in the sintered body 103 in the mounting structure of Comparative Example 1-1, the sintering of the nanoparticle mounting material proceeded not well.

As was clear from Table 1, in the mounting structures of Examples 1-1 to 1-4, the proportion of unsintered nanoparticles was lower than that of the mounting structure of Comparative Example 1-1. Further, generation of the intermetallic compound ($Ag_5Sn$ or the like) and remaining of the nanoparticles of the second metal (Sn) was not observed.

The nanoparticle mounting materials used in the preparation of the mounting structures of Examples 1-1 to 1-4 have the following common points. First, a nanoparticle mounting material containing the nanoparticles of the first metal and the nanoparticles of the second metal solid-dissolved in the first metal is used. The second metal is a metal having a diffusion coefficient in the first metal larger than the self-diffusion coefficient of the first metal. Further, the proportion of the mass of the nanoparticles of the second metal relative to the total mass of the first metal and the second metal is less than or equal to the solid solution limit of the second metal to the first metal.

On the other hand, in Comparative Example 1-2 having a content ratio of the second metal (Sn) relative to the total mass of the nanoparticles of the first metal (Ag) and the nanoparticles of the second metal (Sn) of 12.5 mass % and equal to or larger than the solid solution limit of the Sn in Ag, no unsintered nanoparticles were observed, but the generation of $Ag_5Sn$, an intermetallic compound, was observed in the sintered body 103.

In Comparative Examples 1-3 and 1-4 having a diffusion coefficient in Ag smaller than the self-diffusion coefficient of Ag in Ag, the proportion of the unsintered nanoparticles was larger than that of Comparative Example 1-1, and when the unsintered nanoparticles were measured, the remaining of Sb and Pd was observed.

Example 2

In Example 2, amounting structure was prepared and evaluated in the same manner as in Example 1 except that the second metal was Cu, Pb, and Ge.

The diffusion coefficient of Cu in Ag at 200° C. is $10^{-17}$ $m^2$/sec, the diffusion coefficient of Pb in Ag at 200° C. is $10^{-22}$ $m^2$/sec, and the diffusion coefficient of Ge in Ag at 200° C. is $10^{-22}$ $m^2$/sec. These diffusion coefficients are all larger than the self-diffusion coefficient of Ag in Ag at 200° C.

A mixing ratio of the nanoparticles of the second metal was adjusted such that a mass of Cu, Pb, and Ge relative to the total mass of Ag was half the solid solution limit at 200° C. in the equilibrium state diagram of Ag and each element.

Table 2 shows, in Example 2, the types of the first metal and the second metal, the proportion (content ratio) of the mass of the nanoparticles of the second metal (Sn) and the total mass of the nanoparticles of the first metal (Ag) and the mass of the nanoparticles of the second metal (Sn), and the results of the above evaluation. In order to facilitate the comparison, the nanoparticle mounting materials used in Example 1-2 and Comparative Example 1-1 and evaluation results are also shown in Table 2.

TABLE 2

| | Nanoparticle mounting material | | | Evaluation | | | |
|---|---|---|---|---|---|---|---|
| | First metal | Second metal | Second metal mass/ first metal mass (%) | Unsintered proportion (%) | Intermetallic compound | Remaining of second metal | Acceptability |
| Example 1-2 | Ag | Sn | 5.0 | 25 | No | No | ○ |
| Example 2-1 | Ag | Cu | 0.17 | 29 | No | No | ○ |

TABLE 2-continued

|  | Nanoparticle mounting material | | | Evaluation | | | |
|---|---|---|---|---|---|---|---|
|  | First metal | Second metal | Second metal mass/ first metal mass (%) | Unsintered proportion (%) | Intermetallic compound | Remaining of second metal | Acceptability |
| Example 2-2 | Ag | Pb | 0.4 | 31 | No | No | ○ |
| Example 2-2 | Ag | Ge | 0.7 | 31 | No | No | ○ |
| Comparative Example 1-1 | Ag | Sn | 0.0 | 33 | No | No | X |

As was clear from Table 2, even when a metal other than Sn was used as the second metal, in the mounting structures of Examples 2-1 to 2-3, the proportion of unsintered nanoparticles was lower than that of the mounting structure of Comparative Example 1-1. Further, the generation of the intermetallic compound and the remaining of the nanoparticles of the second metal were not observed.

The nanoparticle mounting materials used in the preparation of the mounting structures of Examples 2-1 to 2-3 have the following common points. First, a nanoparticle mounting material containing the nanoparticles of the first metal and the nanoparticles of the second metal solid-dissolved in the first metal is used. The second metal is a metal having a diffusion coefficient in the first metal larger than the self-diffusion coefficient of the first metal. Further, the proportion of the mass of the nanoparticles of the second metal relative to the total mass of the first metal and the second metal is less than or equal to the solid solution limit of the second metal to the first metal.

In Example 2-1 using Cu as the second metal, despite a small weight ratio of the second metal, the proportion of the unsintered nanoparticles decreased. This is because the diffusion coefficient of Cu in Ag is considerably larger than other elements.

Example 3

The mounting structure was prepared and evaluated in the same manner as in Example 1 except that the first metal was Cu and the second element was Ge.

The diffusion coefficient of Ge in Cu at 200° C. is $10^{-23}$ m$^2$/sec, and the self-diffusion coefficient of Cu in Cu at 200° C. is $10^{-29}$ m$^2$/sec. The diffusion coefficient of Ge in Cu at 200° C. is larger than the self-diffusion coefficient of Cu in Cu at 200° C.

The mixing ratio of the nanoparticles of the second metal (Ge) was adjusted such that a mass of Ge relative to a total mass of Cu is half the solid solution limit at 200° C. in the equilibrium state diagram of Cu and Ge.

Table 3 shows, in Example 3, types of the first metal and the second metal, the proportion (content ratio) of the mass of the nanoparticles of the second metal (Ge) relative to the total mass of the nanoparticles of the first metal (Cu) and the nanoparticles of the second metal (Ge), and the results of the above evaluation.

TABLE 3

|  | Nanoparticle mounting material | | | Evaluation | | | |
|---|---|---|---|---|---|---|---|
|  | First metal | Second metal | Second metal mass/ first metal mass (%) | Unsintered proportion (%) | Intermetallic compound | Remaining of second metal | Acceptability |
| Example 3-1 | Cu | Ge | 6.0 | 41 | No | No | ○ |
| Comparative Example 3-1 | Cu | — | 0.0 | 62 | No | No | ○ |

As was clear from Table 3, even when a metal other than Ag was used as the first metal, in the mounting structure of Example 3-1, the proportion of unsintered nanoparticles was lower than that of the mounting structure of Comparative Example 3-1. Further, the generation of the intermetallic compound and the remaining of the nanoparticles of the second metal were not observed.

The nanoparticle mounting material for preparing the mounting structure of Example 3-1 has the following features. First, the nanoparticle mounting material containing the nanoparticles of the first metal and the nanoparticles of the second metal solid-dissolved in the first metal is used. The second metal is a metal having a diffusion coefficient in the first metal larger than the self-diffusion coefficient of the first metal. Further, the proportion of the mass of the nanoparticles of the second metal relative to the total mass of the first metal and the second metal is less than or equal to the solid solution limit of the second metal to the first metal.

(Summary)

Although the lead frame 105 has been described, the lead frame 105 may be a metal member. For example, a heat sink may be used.

INDUSTRIAL APPLICABILITY

According to the mounting structure of the invention, it is possible to provide a mounting structure in which the time required for bonding is shortened, thermal damage to the peripheral member is small, and physical properties of the nanoparticles the metal of are secured, which is required for a device with large heat generation such as a power device.

REFERENCE SIGNS LIST

101: SEMICONDUCTOR ELEMENT
102: ELEMENT ELECTRODE
103: SINTERED BODY
104: LEAD FRAME ELECTRODE

105: LEAD FRAME
108: MOUNTING STRUCTURE

The invention claimed is:

1. A mounting structure comprising:
a semiconductor element including an element electrode;
a metal member; and
a sintered body configured to bond the semiconductor element and the metal member, wherein
the sintered body contains a first metal and a second metal solid-dissolved in the first metal,
the second metal is a metal having a diffusion coefficient in the first metal larger than a self-diffusion coefficient of the first metal, and
a content ratio of the second metal relative to a total mass of the first metal and the second metal in the sintered body is equal to or lower than a solid solution limit of the second metal to the first metal, and
wherein (1) the first metal is Ag and the second metal is Pb, or (2) the first metal is Cu and the second metal is Ge.

2. The mounting structure according to claim 1, wherein the metal member is a lead frame or a heat sink.

3. The mounting structure according to claim 1, wherein the diffusion coefficient, the self-diffusion coefficient, and the solid solution limit are determined at 200° C.

* * * * *